(12) United States Patent
Bertrand et al.

(10) Patent No.: US 10,392,696 B2
(45) Date of Patent: Aug. 27, 2019

(54) CHEMICAL VAPOUR INFILTRATION APPARATUS HAVING A HIGH LOADING CAPACITY

(71) Applicant: HERAKLES, Le Haillan (FR)

(72) Inventors: Sebastien Bertrand, Moulis en Medoc (FR); Franck Lamouroux, Le Taillan Medoc (FR); Stephane Goujard, Merignac (FR); Cedric Descamps, Eysines (FR)

(73) Assignee: SAFRAN CERAMICS, Le Haillan (FR)

( * ) Notice: Subject to any disclaimer, the term of this patent is extended or adjusted under 35 U.S.C. 154(b) by 732 days.

(21) Appl. No.: 14/415,042

(22) PCT Filed: Jul. 12, 2013

(86) PCT No.: PCT/FR2013/051674
§ 371 (c)(1),
(2) Date: Jan. 15, 2015

(87) PCT Pub. No.: WO2014/013168
PCT Pub. Date: Jan. 23, 2014

(65) Prior Publication Data
US 2015/0218693 A1 Aug. 6, 2015

(30) Foreign Application Priority Data
Jul. 19, 2012 (FR) ...................................... 12 57012

(51) Int. Cl.
*C23C 16/04* (2006.01)
*C23C 16/46* (2006.01)
(Continued)

(52) U.S. Cl.
CPC ............ *C23C 16/045* (2013.01); *C23C 16/26* (2013.01); *C23C 16/458* (2013.01); *C23C 16/46* (2013.01)

(58) Field of Classification Search
CPC ........................ C23C 16/045; C04B 2235/608
See application file for complete search history.

(56) References Cited

U.S. PATENT DOCUMENTS

| 5,480,678 A | 1/1996 | Rudolph et al. |
| 5,904,957 A | 5/1999 | Christin et al. |

(Continued)

FOREIGN PATENT DOCUMENTS

| CN | 1282801 A | 2/2001 |
| CN | 1528949 A | 9/2004 |

(Continued)

OTHER PUBLICATIONS

International Search Report for corresponding International PCT Application No. PCT/FR2013/051674, dated Sep. 26, 2013.

*Primary Examiner* — Parviz Hassanzadeh
*Assistant Examiner* — Nathan K Ford
(74) *Attorney, Agent, or Firm* — Workman Nydegger

(57) ABSTRACT

An installation for chemical vapor infiltration of porous preforms of three-dimensional shape extending mainly in a longitudinal direction, the installation comprising a reaction chamber of parallelepiped shape, the side walls of the reaction chamber including heater means and a plurality of stacks of loader devices arranged in the reaction chamber. Each loader device being in the form of an enclosure of parallelepiped shape provided with support elements for receiving porous preforms for infiltrating.

10 Claims, 10 Drawing Sheets

(51) Int. Cl.
   *C23C 16/26*       (2006.01)
   *C23C 16/458*      (2006.01)

(56) References Cited

U.S. PATENT DOCUMENTS

| | | |
|---|---|---|
| 6,109,209 A | 8/2000 | Rudolph et al. |
| 8,163,088 B2 | 4/2012 | Lamouroux et al. |
| 8,491,963 B2 | 7/2013 | Lamouroux et al. |
| 2004/0237898 A1 | 12/2004 | Bernard et al. |
| 2004/0253377 A1* | 12/2004 | Bok .................. C23C 16/045 |
| | | 427/249.2 |
| 2005/0183824 A1* | 8/2005 | Lee .................. H01L 21/67126 |
| | | 156/345.31 |
| 2008/0152803 A1 | 6/2008 | Lamouroux et al. |
| 2012/0171375 A1 | 7/2012 | Lamouroux et al. |

FOREIGN PATENT DOCUMENTS

| | | | |
|---|---|---|---|
| EP | 1072693 | A1 | 1/2001 |
| FR | 2882064 | A1 | 8/2006 |

\* cited by examiner

CHEMICAL VAPOUR INFILTRATION APPARATUS HAVING A HIGH LOADING CAPACITY

BACKGROUND OF THE INVENTION

The present invention relates to the chemical vapor infiltration techniques used in particular when making parts out of thermostructural composite material. The invention relates more particularly to chemical vapor infiltration of porous substrates of complex three-dimensional shapes such as fiber preforms for use in fabricating aeroengine blades.

In order to fabricate parts out of composite material, in particular parts made of thermostructural composite material constituted by a preform made of refractory fibers (e.g. carbon fibers or ceramic fibers) densified by a refractory matrix (e.g. of carbon and/or ceramic), it is common practice to make use of infiltration methods. Examples of such parts are: thruster nozzles made of carbon-carbon (C—C) composite; brake disks, in particular for airplane brakes, made of C—C composites; and blades made of ceramic matrix composite (CMC). Likewise, before, during, or after densification of preforms, one or more layers, e.g. of interphase material, may be deposited in the preforms, likewise by using the chemical vapor infiltration technique.

Chemical vapor infiltration consists in placing the substrates in a reaction chamber of an infiltration installation with the help of support tooling, and in admitting a reagent gas into the chamber, with one or more constituents of the gas being precursors for the material that is to be deposited within the substrates in order to densify them and/or in order to deposit a layer, e.g. of interphase material. Infiltration conditions, in particular concerning the composition and the flow rate of the reagent gas, and also the temperature and pressure inside the chamber, are selected so as to enable the gas to diffuse within the accessible internal pores of the substrates in order to cause the desired material to be deposited therein by decomposing a constituent of the gas or by a reaction between a plurality of constituents of the gas. The reagent gas is conventionally pre-heated by passing the gas through a preheater zone situated in the reaction chamber, and into which the reagent gas inlet opens out. That method corresponds to the free flow chemical vapor infiltration method.

In an industrial chemical vapor infiltration installation, it is common practice to load the reaction chamber with a plurality of substrates or preforms for densifying simultaneously in order to increase the throughput of the densification method, and consequently in order to increase the loading factor of the reaction chambers.

Methods and installations for chemical vapor infiltration of porous annular substrates are described in particular in documents US 2004/237898 and U.S. Pat. No. 5,904,957. Nevertheless, those methods apply essentially to infiltrating substrates of annular shape that are arranged in stacks, and they are not adapted to infiltrating substrates that present shapes that are not axisymmetric.

Document US 2008/0152803 describes the use of loader tooling comprising a tubular duct arranged between first and second plates, and around which thin substrates are arranged radially in the form of a plate for densifying. The tooling as loaded in that way is then arranged inside a reaction chamber of an infiltration oven having its reagent gas admission inlet connected to the tubular duct for enabling a reagent gas to be admitted into the duct, which then distributes the gas along the main faces of the substrates in a flow direction that is essentially radial.

Nevertheless, that loader tooling remains limited to directed-flow densification of thin substrates that are simple in shape, such as fine rectangular plates, and it cannot be used for uniform densification of porous substrates presenting complex three-dimensional shapes, such as fiber preforms for blades. Specifically, the flow of a stream of gas over substrates of complex three-dimensional shape is more difficult to control. Likewise, that type of tooling gives rise to thermal dispersion that makes it difficult to obtain easy control over temperature at all points of the preforms and between the preforms. The lack of control over the flow of the reagent gas over all of the preforms that are to be infiltrated gives rise to gradients appearing in densification or deposition within the substrates. However, obtaining uniform densification or deposition within a substrate is essential for the mechanical performance of the resulting part.

Also, the loading factor in infiltration installations using tooling in which the preforms for infiltrating are arranged radially is relatively low. Industrial scale production of parts of complex three-dimensional shape then requires a large number of infiltration installations to be fabricated and used, which is highly penalizing in economic terms.

OBJECT AND SUMMARY OF THE INVENTION

An object of the invention is to provide a solution that enables porous preforms to be infiltrated, in particular preforms of complex three-dimensional shape that extend mainly in a longitudinal direction, to do so with a high loading capacity, and while ensuring uniform deposition within the preforms.

This object is achieved with an installation for chemical vapor infiltration of fiber preforms of three-dimensional shape extending mainly in a longitudinal direction, the installation comprising:

a reaction chamber of parallelepiped shape, the side walls of the reaction chamber including heater means; and a plurality of stacks of loader devices arranged in the reaction chamber, each loader device being in the form of an enclosure of parallelepiped shape provided with support elements for receiving fiber preforms for infiltrating.

Thus, by using both a reaction chamber and stacks of loader devices that are of parallelepiped shape, it is possible to increase very significantly the preform loading factor of the installation compared with infiltration installations that use annular loader devices. Specifically, since the loader devices present a loading space of parallelepiped shape, the preforms can be arranged parallel one beside another in their longitudinal direction, thus making it possible to obtain an optimum occupation factor for the loading volume of each loader device. With an annular loader device as in the prior art, the preforms are arranged radially, which does not make it possible to achieve optimal occupation of the loading volume.

Also, because of their parallelepiped shape, once the loader devices have been stacked on one another they form stacks that enable the reaction chamber to be filled optimally, which chamber is likewise of parallelepiped shape. By selecting appropriate dimensions for the loader devices constituting the stacks, it is possible to form a preform load that is suitable for occupying all of the working loading volume of the infiltration installation.

Each loader device present in the chamber also forms a heat sink and consequently acts individually as a susceptor.

Furthermore, in each stack, the loader devices cooperate with one another to form a loading volume that extends in a vertical direction in the reaction chamber, thus enabling flow to take place in substantially rectilinear manner within each stack, and consequently achieving better control over the flow and over the depleting the gas. In spite of a large number of preforms present in a single load of the invention, the gas passes through only a limited number of preforms in each stack, thus making it possible to avoid excessively depicting the gas as it passes through the preforms.

Finally, temperature can be controlled in more uniform manner in the reaction chamber since the chamber is heated at least via the side walls of the chamber.

In a first aspect of the invention, the reaction chamber is of rectangular parallelepiped shape, and it includes at least one row of a plurality of stacks of loader devices, said row extending in the longitudinal direction of the reaction chamber. Since the heating of the reaction chamber is provided in particular by the side walls of the reaction chamber, there is no restriction on the length of the chamber, and consequently there is no restriction on the length of the load, thus making it possible to obtain a very large loading factor.

In a second aspect of the invention, each loader device is formed by an enclosure of rectangular parallelepiped shape, the stacks being positioned in the chamber in such a manner that each loader device extends longitudinally in the reaction chamber in a direction perpendicular to the longitudinal direction of the chamber.

In a third aspect of the invention, the reaction chamber has a plurality of rows of stacks of loader devices extending in the longitudinal direction of the reaction chamber, heater means being arranged between two rows of stacks of loader devices. Under such circumstances, the width of the reaction chamber may be increased while keeping control over temperature in this dimension.

In a fourth aspect of the invention, each stack includes at each of its ends a respective buffer that is to be empty of porous substrates for densifying. At the top of the stack, i.e. at the location where the gas is introduced, the buffer zone serves in particular to avoid the gas impacting directly against the preforms on leaving the preheater zone. At the bottom of each stack, the buffer zone serves to redirect the gas streams before they are discharged from the reaction chamber.

In a fifth aspect of the invention, the horizontal walls of the reaction chamber include heater means.

In a sixth aspect of the invention, the loader devices of each stack comprise fiber preforms for aeroengine blades In a seventh aspect of the invention, the blade fiber preforms are in alignment one beside another having their pressure side faces or suction side faces oriented in a common direction. Under such circumstances, in each stack of loader devices, the fiber preforms of a first loader device are preferably in alignment one beside another with their pressure side faces or their suction side faces oriented in a first direction, while the fiber preforms of a second loader device adjacent to said first device are in alignment one beside another with their pressure side faces or suction side faces oriented in a second direction opposite to the first direction. This makes it possible to obtain a better flow of the gas streams close to the preforms.

BRIEF DESCRIPTION OF THE DRAWINGS

Other characteristics and advantages invention appear from the following description of particular implementations of the invention, given as nonlimiting examples, and with reference to the accompanying drawings, in which.

DETAILED DESCRIPTION OF EMBODIMENTS

The present invention applies to chemical vapor infiltration of porous preforms. The infiltration may be performed in particular in order to densify preforms and/or to deposit layers within the preforms, such as interphase layers.

Figure 1:
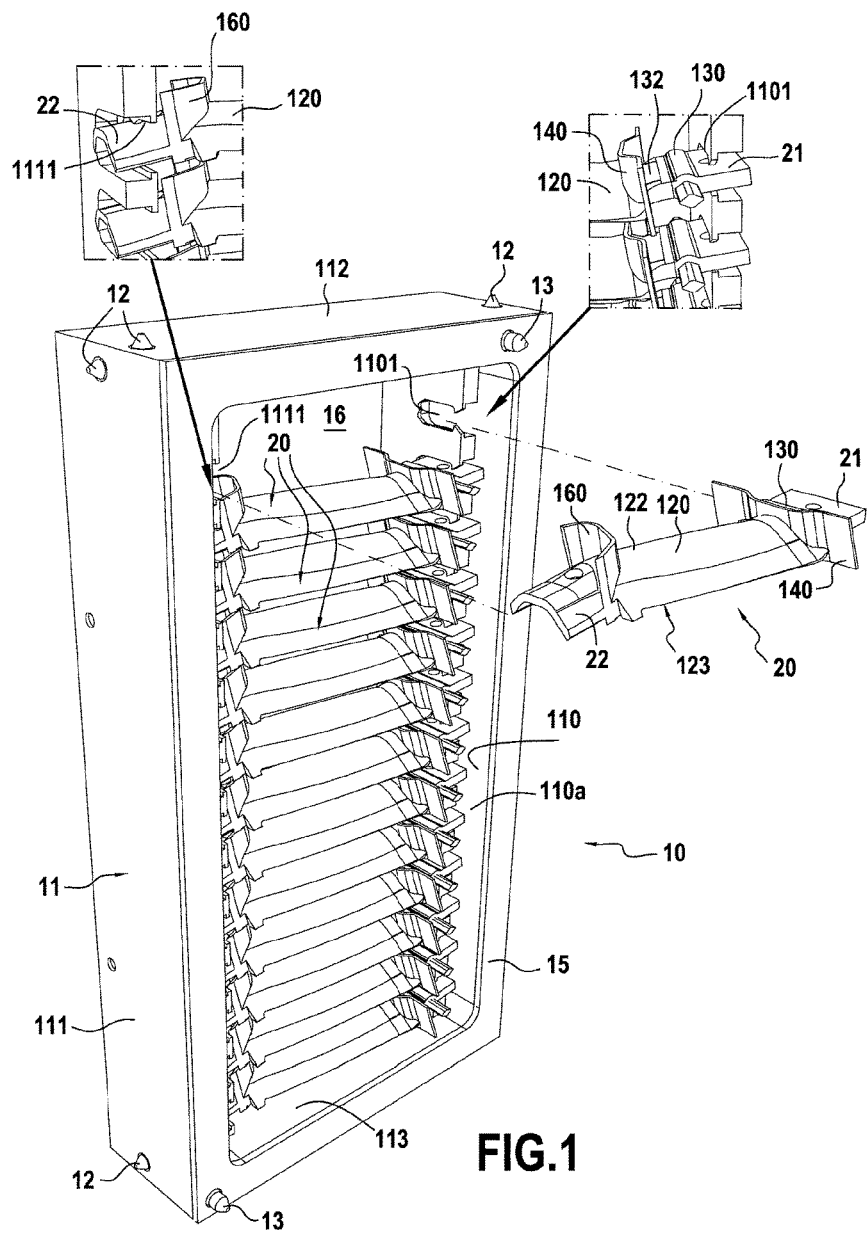
FIG. 1 is a perspective view of a loader device with blade preforms in accordance with an embodiment of the invention.
Figure 2:
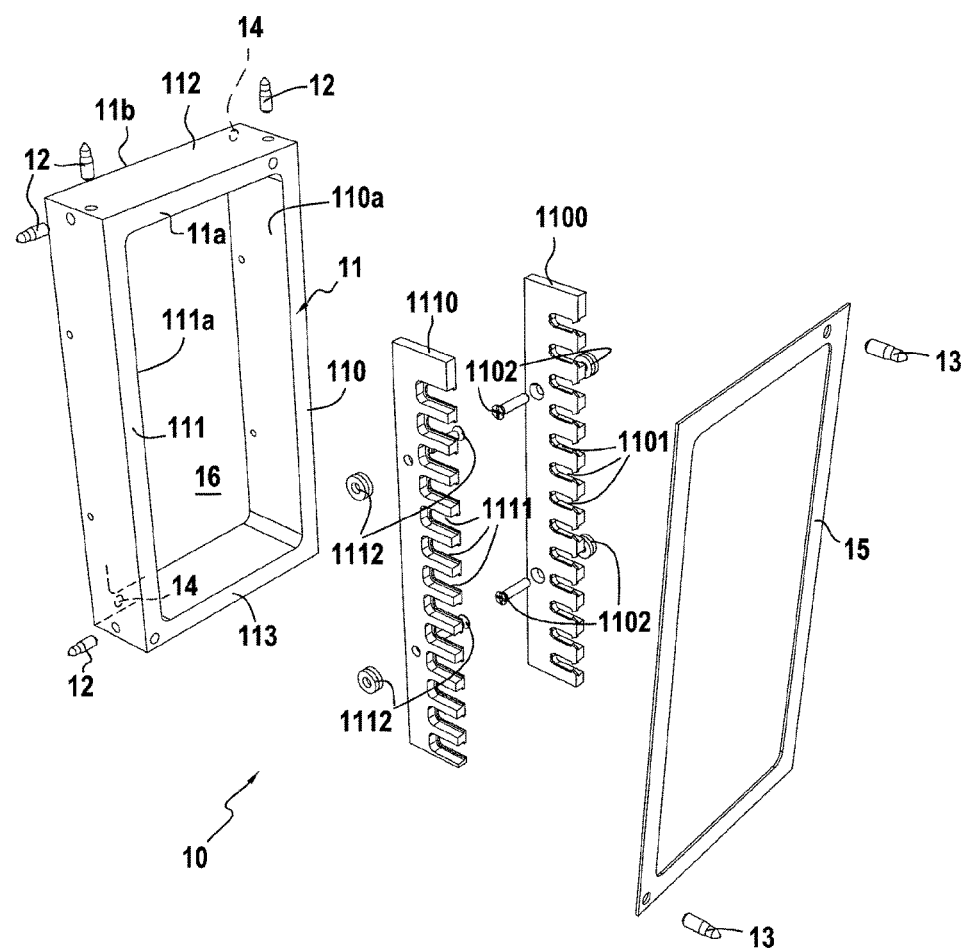
FIG. 2 is an exploded view of the FIG. 1 loader device.

FIGS. 1 and 2 show a loader device or tooling 10 that, once loaded with substrates for infiltrating, is for placing in a reaction chamber of parallelepiped shape in an industrial chemical vapor infiltration installation. In the presently described example, the tooling 10 is for receiving fiber preforms 20 for aeroengine blades.

Each preform 20 extends in a longitudinal direction between two ends 21 and 22, and comprises an airfoil 120 and a root 130 formed by a portion of greater thickness, e.g. having a bulb-shaped section, and extended by a tang 132 (FIG. 1). The airfoil 120 extends in the longitudinal direction between its root 130 and its tip 121, and in cross-section it presents a curved profile of varying thickness that defines two faces 122 123 that correspond respectively to the suction side face and to the pressure side face of the airfoil 120. In the presently described example, the airfoil 120 also includes an inner blade platform 140 and an outer blade platform 160.

The presently described loader device 10 is constituted by a support frame or enclosure 11 of rectangular parallelepiped shape having two longitudinal walls 110 and 111 and two transverse walls 112 and 113, the longitudinal walls 110 and 111 defining between them a loading space 16 for the preforms 20. Each longitudinal wall is provided with support elements that are to receive one of the ends 21 and 22 of each blade preform 20. More precisely, a first support plate 1100 including notches 1101 that are uniformly distributed along the length of the plate 1100 is fastened to the inside portion 110a of the wall 110 by means of clamping members 1102 of the nut-and-bolt type. The notches 1101 are for receiving the ends 21 of the preforms 20. Likewise, a second support plate 1110 including notches 1111 that are uniformly distributed along the length of the plate 1110 is fastened to the inside portion 111a of the wall 111 by means of clamping members 1112 of the nut-and-bolt type. The notches 1111 are for receiving the ends 22 of the preforms 20. In a variant embodiment, the notches are machined directly in the longitudinal walls of the loader device.

Once the preforms 20 have been positioned in the loader device 10, they extend longitudinally between the walls 110 and 111, thus making it possible to obtain a device having good loading capacity. Furthermore, the use of support means in the walls makes it possible to minimize the area of contact between the substrates for densifying and the loader device, and consequently to offer a good accessible area for infiltration of the reagent gas.

In the presently described example, the loader device also has centering pegs 12 arranged on the outer portions of the longitudinal wall 111 and of the transverse wall 112, together with two keying pegs 13 arranged on the top portion 11a of the frame 11 and two keying orifices 14 arranged in the bottom portion 11b of the frame 11. The keying orifices 14 are for co-operating with the keying pegs of another, similar loader device when the devices are stacked. The keying orifices 14 are placed in positions that are offset relative to the keying pegs 13 so as to enable the preforms 20 to be reversed through 180° from one loader device to the next when stacking such devices, as described in greater detail below. The loader device also has a graphite gasket 15 arranged on the top portion 11a of the frame 11, the gasket being designed to avoid sticking to another loader device stacked therewith, and to facilitate separating it after the preforms have been densified.

Figure 3:
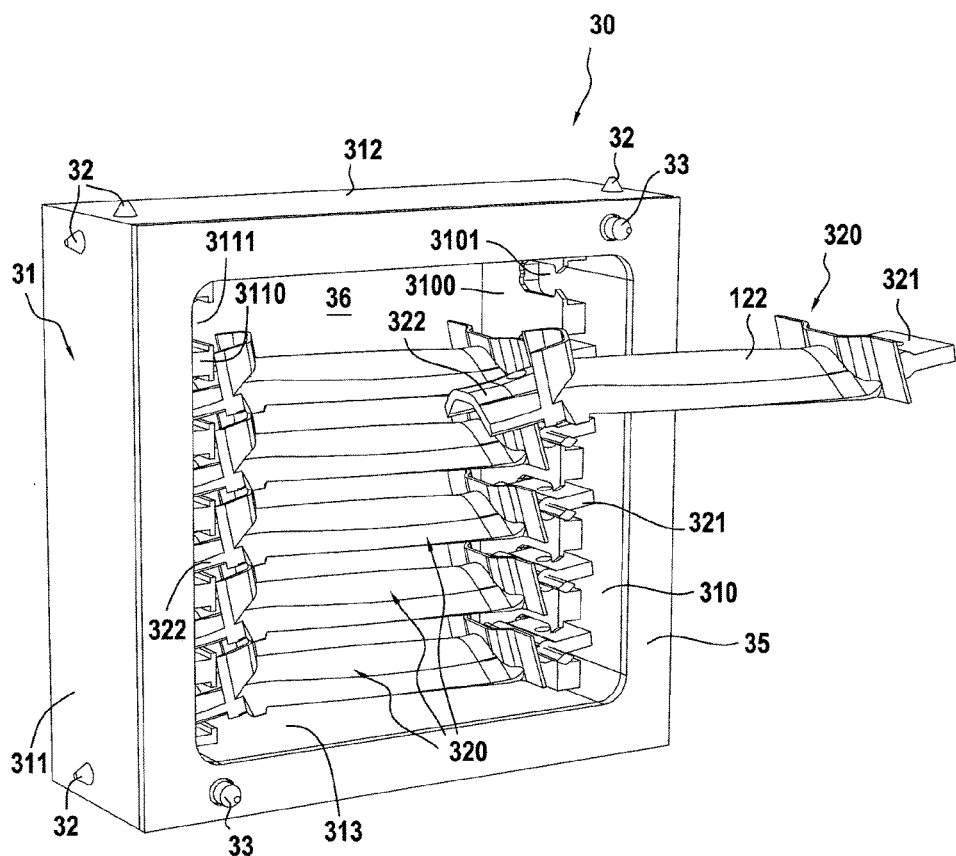
FIG. 3 is a perspective view of a loader device with blade preforms in accordance with another embodiment of the invention.

FIG. 3 shows another loader device 30 of the invention that differs from the above-described loader device 10 in that it presents a shape that is square. The loader device 30 comprises a support frame or enclosure 31 of square shape having four walls 310 to 313, the longitudinal walls 310 and 311 defining between them a loading space 36 for blade preforms 320 similar to the above-described blade preforms 20. A first support plate 3100 including notches 3101 that are uniformly distributed along the length of the plate 3100 is fastened to the inside portion of the wall 310 by means of clamping members of the nut-and-bolt type (not shown in FIG. 3). The notches 3101 are for receiving the ends 321 of the preforms 320. Likewise, a second support plate 3110 including notches 3111 that are uniformly distributed along the length of the plate 3110 is fastened to the inside portion of the wall 311 by means of clamping members of the nut-and-bolt type (not shown in FIG. 3). The notches 3111 are for receiving the ends 322 of the preforms 320. In a variant embodiment, the notches are machined directly in the longitudinal walls 310 and 311 of the loader device 30.

Once the preforms 320 have been positioned in the loader device 30, they extend longitudinally between the walls 310 and 311, thus making it possible to obtain a device having good loading capacity. Furthermore, the use of support means in the walls makes it possible to minimize the area of contact between the substrates for densifying and the loader device, and consequently to offer a good accessible area for infiltration of the reagent gas.

In the presently described example, the loader device also has centering pegs 32 arranged on the outer portions of the longitudinal wall 311 and of the transverse wall 312, together with two keying pegs 33 arranged on the top portion of the frame 31 and two keying orifices (not shown in FIG. 3) arranged on the bottom portion of the frame 31 in order to cooperate with the keying pegs of another, similar loader device when they are stacked. The loader device also has a graphite gasket 35 arranged on the top portion 31a of the frame 31, the gasket being designed to avoid sticking to another stacked loader device, and to facilitate separating it after the preforms have been densified.

The above-described graphite gaskets are preferably made of expanded graphite such as the materials sold under the trademarks Sigraflex® or Papyex®.

Figure 4:
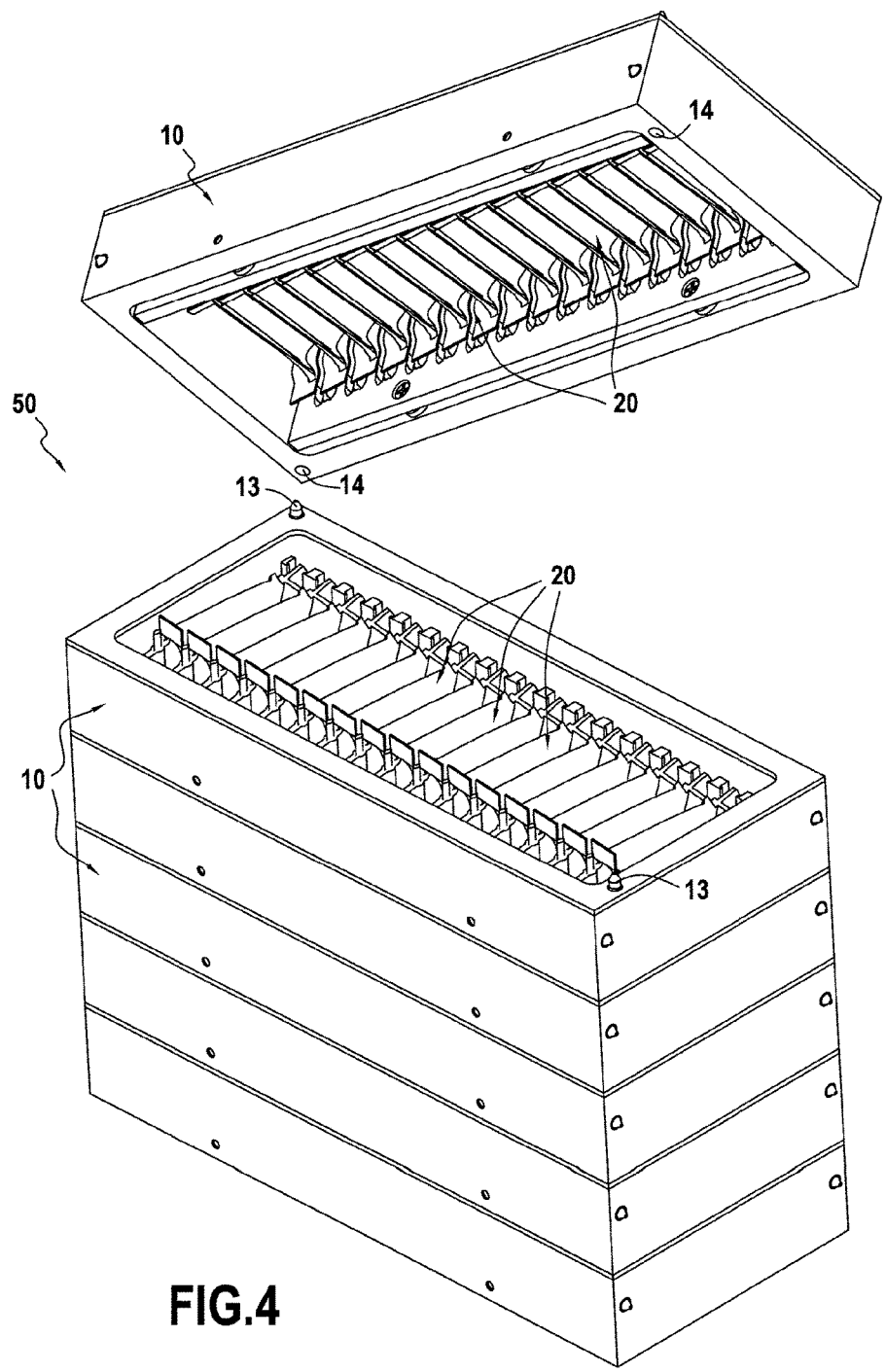
FIG. 4 is a perspective view of a stack made up of a plurality of FIG. 1 loader devices stacked on one another in accordance with an embodiment of the invention.

FIG. 4 shows a stack 50 being made up from a plurality of loader devices 10 as described above with reference to FIGS. 1A and 1B. As shown in FIG. 4, a plurality of loader devices 10 are stacked on one another; they are all identical and each previously loaded with blade preforms 20 for densifying, which preforms are all arranged in the same direction. When stacking a loader device 10 on another that is already present in the stack 50, the orifices 14 of the loader device for stacking cooperate with the keying pegs 13 of the loader device that is already present in the stack so that the device being added is offset by 180° relative to the underlying loader device. Since the blade preforms are all initially loaded in the same orientation in each of the loader devices, they are thus offset by 180° from one loader device to the next in the stack. This angular offset of blade preforms between two adjacent loader devices in a stack leads to a better flow of the stream of reagent gas throughout the entire stack. Specifically, by orienting the pressure side faces (or the suction side faces) of the blade preforms in alternation in one direction and then in the opposite direction from one loader device to the next in the stack, the gas is better distributed between the preforms up the full height of the stack, thereby making it possible to obtain more uniform densification of the preforms.

Figure 5A:
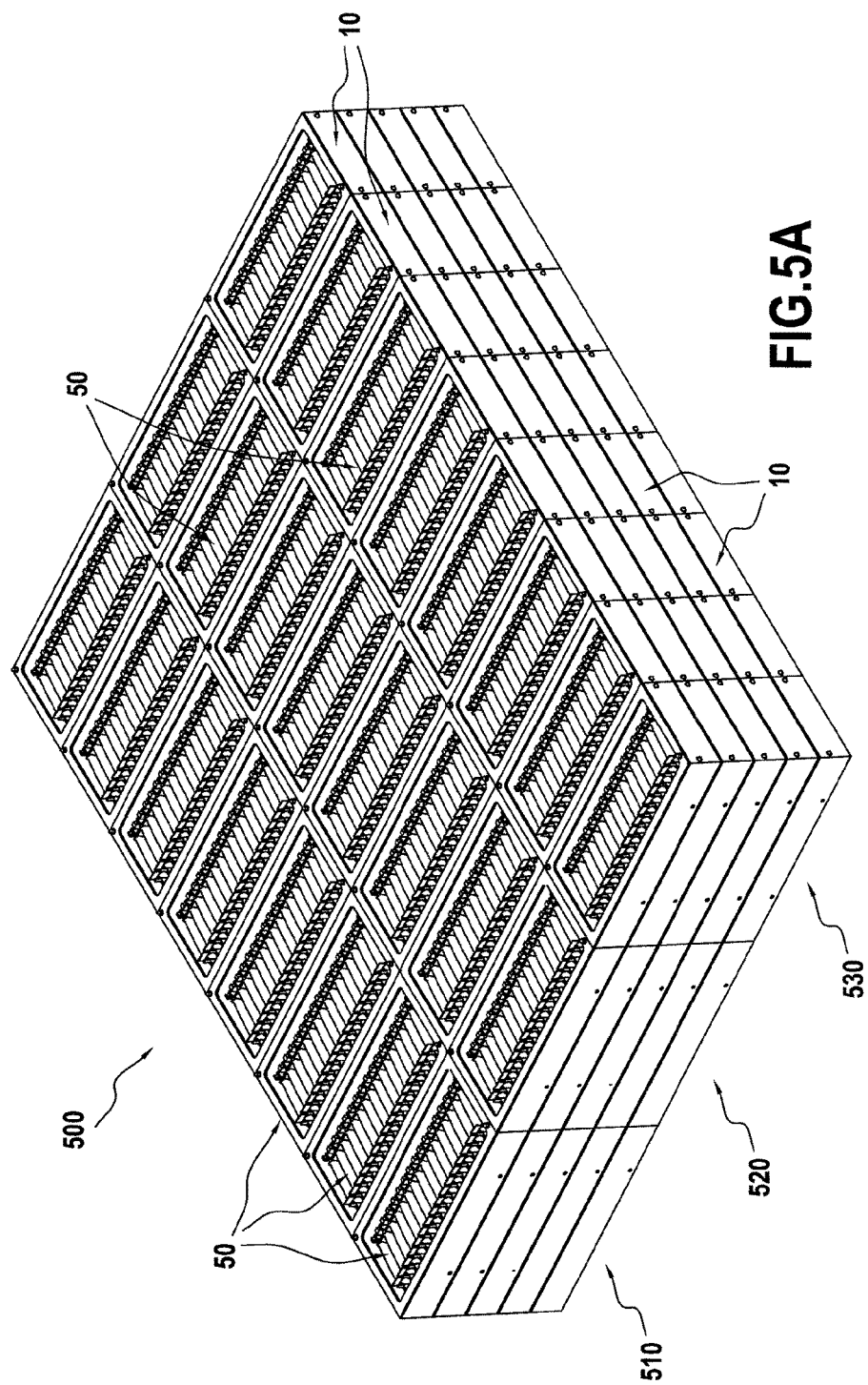
FIG. 5A is a perspective view of a load made up of a plurality of rows of FIG. 4 stacks.
Figure 5B:
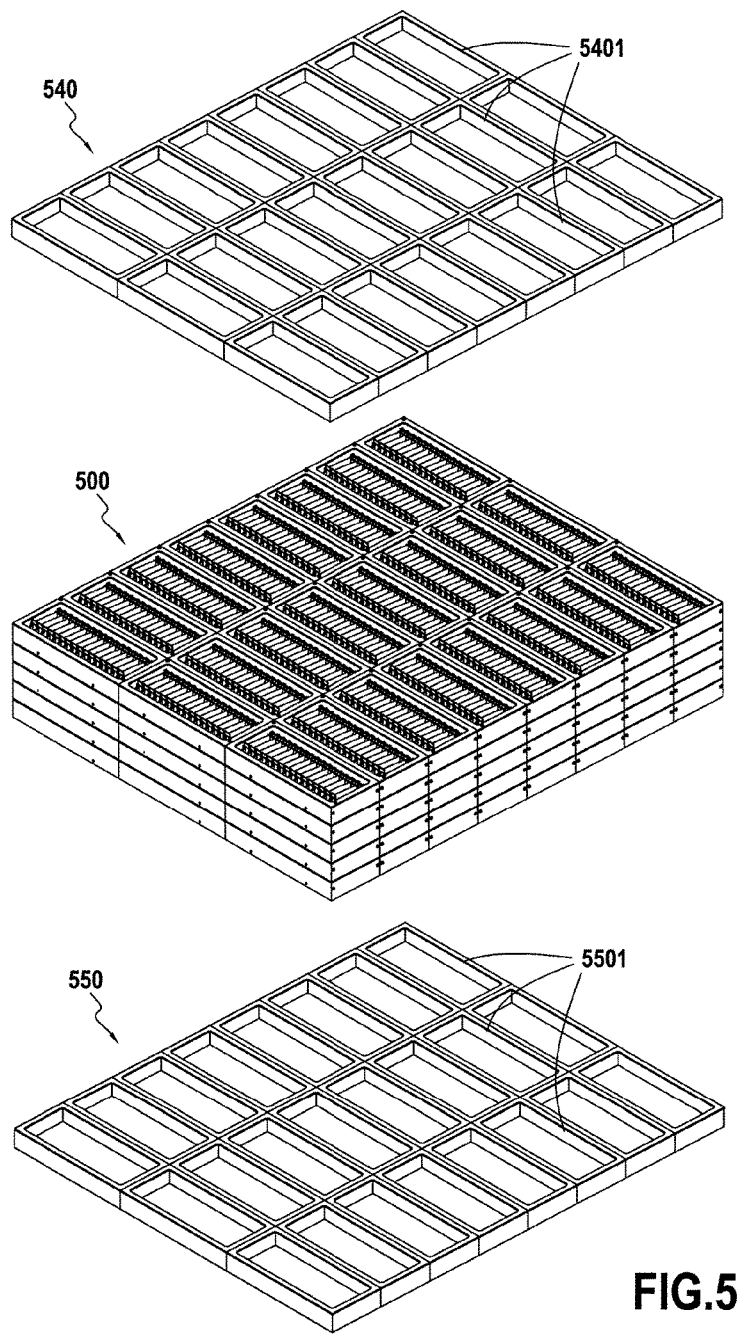
FIG. 5B is a perspective view showing the assembly of buffer zones in the top and bottom portions of the load of FIG. 5A.

FIG. 5A shows a load 500 made up of three rows 510, 520, and 530, each comprising a plurality of stacks 50 as described above with reference to FIGS. 1 and 2 and extending in a longitudinal direction DL. In FIG. 5B, a first buffer zone 540 is arranged on the top portion of the load 500, and a second buffer zone 550 is arranged under the bottom portion of the load 500. Each of the buffer zones 540 and 550 is formed by a number of parallelepiped-shaped frames or enclosures 5401 and 5501 that is identical to the number of stacks 50 present in the load 500, the frames 5401 and 5501 presenting dimensions that are identical to dimensions of the frames 13 of the loader devices 10.

Figure 6:
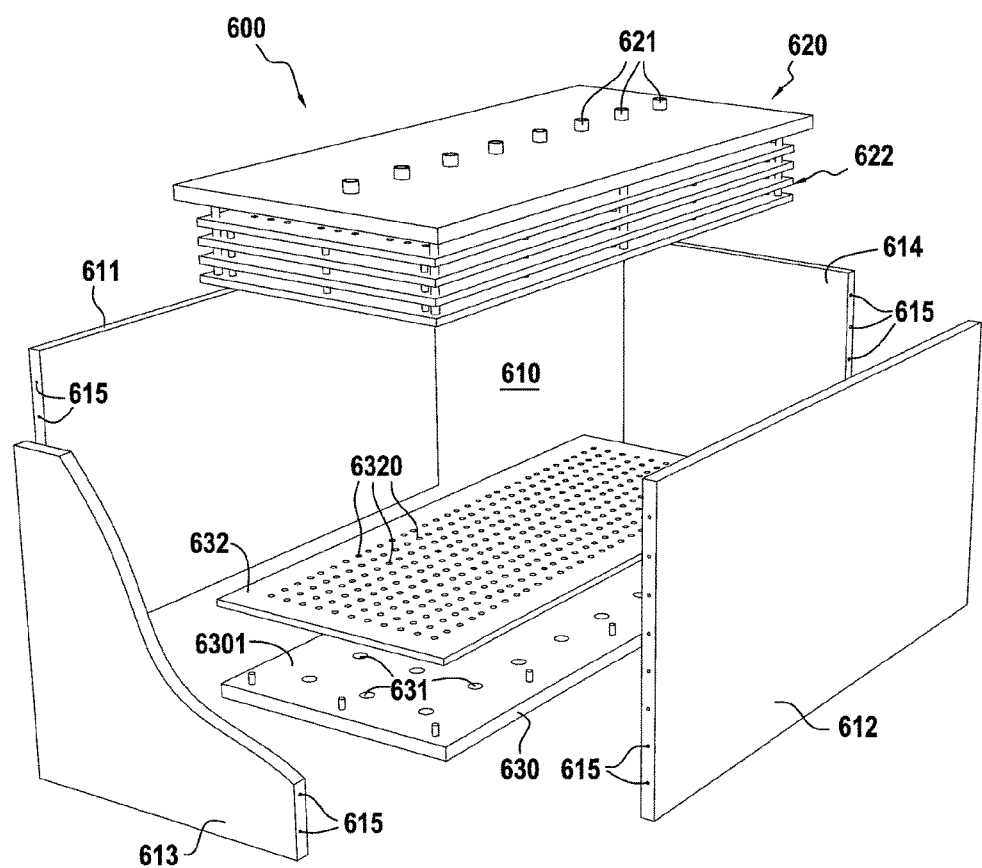
FIG. 6 is an exploded perspective view of a chemical vapor infiltration installation in accordance with an embodiment of the invention.

FIG. 6 is a diagrammatic view of a chemical vapor infiltration installation or oven 600 that is to receive the load 500 containing the porous preforms for densifying. The chemical vapor infiltration installation 600 comprises a reaction chamber 610 of rectangular parallelepiped shape that is defined by four side walls 611 to 614, the walls 611 and 612 extending in the longitudinal direction of the chamber, while the walls 613 and 614 extend in the transverse direction of the chamber. Each of the walls 611 to 614 is provided with a heater means, in this example electrical resistances 615 embedded in each of the walls 611 to 614. The top portion of the reaction chamber is closed by a removable cover 620 provided with gas admission pipes 621 that open out into a preheater zone 622 for heating the gas before it is diffused in the reaction chamber 610 that contains the preforms for densifying. Residual gas is extracted from the bottom 630 of the installation by discharge pipes 631 that are connected to the suction means (not shown). The bottom 630 that closes the bottom portion of the reaction chamber comprises a plate 632 including a plurality of gas discharge orifices 6320, and in use the load 500 stands thereon. The numbers of gas admission pipes 621 and of discharge pipes 631 are determined as a function of the dimensions of the reaction chamber that is to be fed with gas.

The space present in the reaction chamber 610 between the preheater zone 622 and the plate 632 corresponds to the working loading volume of the infiltration installation 600, i.e. the volume that is available for loading fiber preforms for infiltrating.

Figure 7:
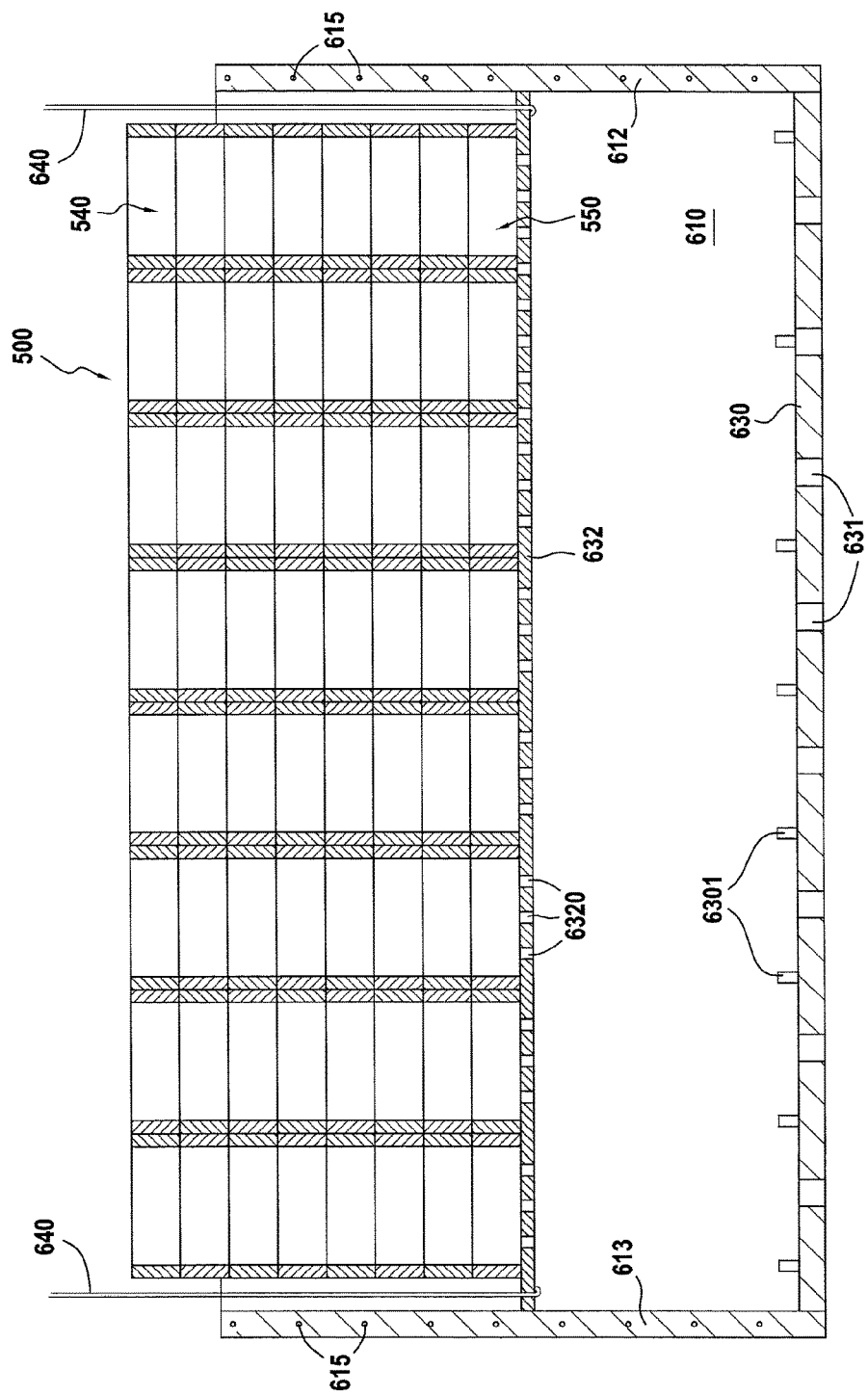
FIG. 7 is a section view showing the load of FIG. 5B being put into place in the FIG. 6 chemical vapor infiltration installation.

There follows a description of putting the load 500 comprising the stacks 50 of porous preforms 20 into place in the chemical vapor infiltration installation 600. As shown in FIG. 7, the cover 620 is removed from the installation 600 in order to enable the load 500 together with the first and second buffer zones 540 and 550 to be inserted into the reaction chamber 610. The load 500 is lowered into the chamber 610 by means of the plate 632 and of hanger rods 640, until the plate 632, and consequently the load 500, rests on the support on the bottom 630 via the spacers 6301.

Figure 8:
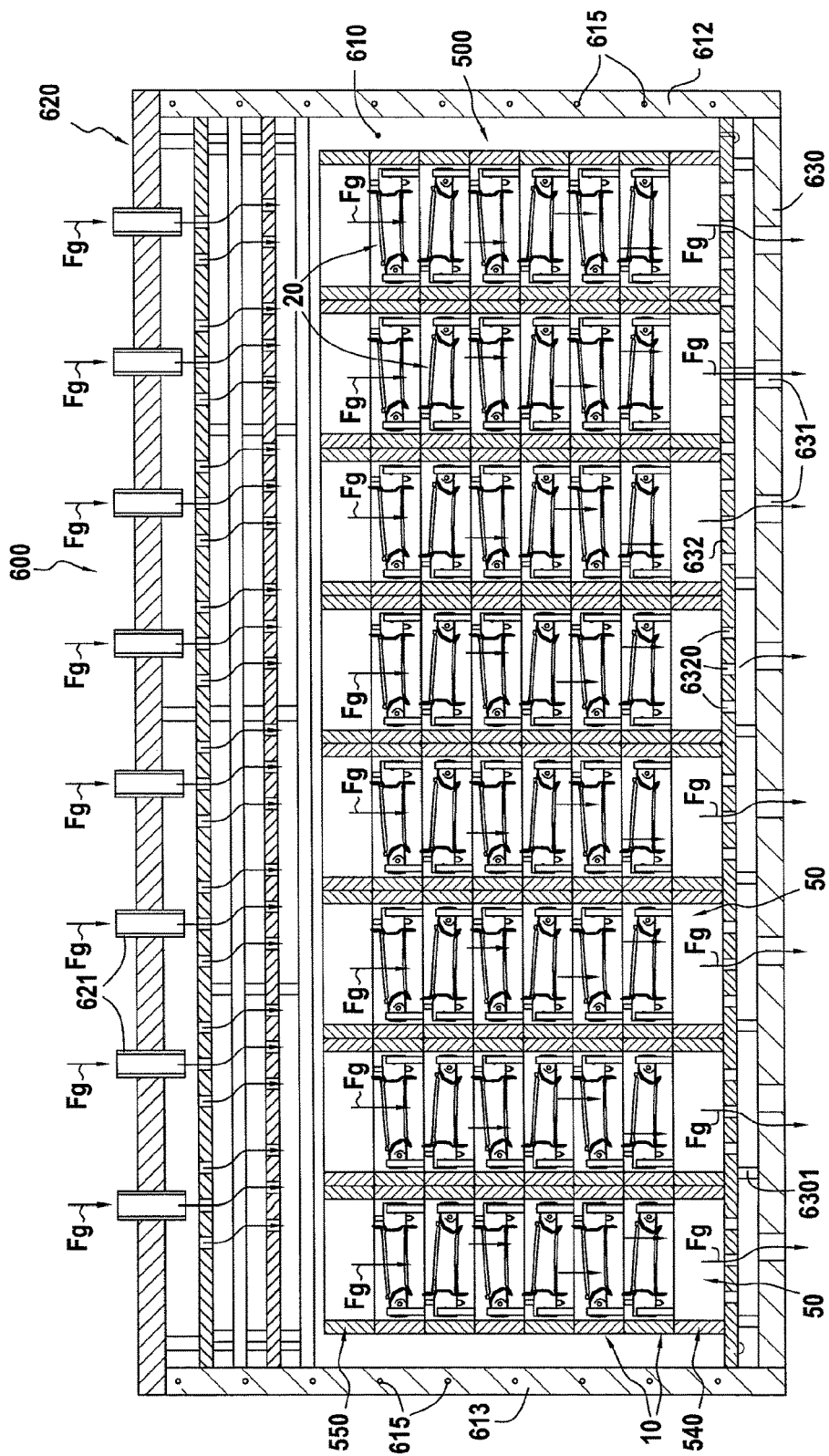
FIG. 8 is a section view showing the path followed by reagent gas streams while densifying porous preforms while the FIG. 6 installation is in operation.

Once the load 500 is in position in the reaction chamber 610, the cover 620 is put into place on the top portion of the reaction chamber as shown in FIG. 8. The chemical vapor infiltration installation is then ready to operate.

In the presently described example, the installation is used for densifying the porous preforms. In order to densify the preforms, a reagent gas containing one or more precursors of the material of the matrix that is to be deposited is introduced into the reaction chamber 610. By way of example, with carbon, gaseous hydrocarbon compounds are used, typically propane, methane, or a mixture of both. In well-known manner, with a ceramic material, such as silicon carbide (SiC) for example, it is possible to use methyl trichlorosilane (MTS) as a precursor for SiC.

In well-known manner, the porous preforms are densified by depositing within them the matrix material as produced by decomposition of the precursor(s) contained in the reagent gas diffusing within the accessible internal pores of the substrates. The pressure and temperature conditions needed for obtaining a variety of matrix deposits by chemical vapor infiltration are themselves well-known.

Each loader device present in the chamber forms a heat sink. Thus, once the heater means of the walls of the reaction chamber have been activated, each loader device acts individually as a susceptor serving to raise the temperature of the preforms present in each device.

FIG. 8 shows the paths followed by the streams of reagent gas Fg introduced into the reaction chamber 610 by the admission pipe 621. A pressure gradient is established between the feed pipes 621 and the discharge pipes 631 in order to enhance the passage of streams of reagent gas through the loader devices 10 in each stack 50. The streams Fg pass initially through the preheater zone 622 and then penetrate into the first buffer zone 540, which serves to prevent the gas that leaves the preheater zone from impacting directly against the preforms. The reagent gas streams Fg then flow through the loader devices 10 of each stack 50, starting from the tops 50a of the stacks and going to the bottoms 50b thereof, where the residues of the gas streams that have not reacted with the preforms pass through the second buffer zone 550, which serves to redirect the streams prior to being discharged, the streams then passing through the discharge orifices 6320 in the plate 632 so as to be extracted from the reaction chamber 610 via the discharge pipes 631.

The load of the invention is constituted by one or more stacks of loader devices of parallelepiped shape, e.g. of rectangular or of square parallelepiped shape, as described above. The stacks of devices are organized as one or more rows.

In general manner, the shapes and the dimensions of the loader devices, and also the way they are arranged in the stacks and the row(s) of stacks constituting the load are selected in such a manner as to optimize as well as possible the loading factor of preforms in the infiltration installation.

Because of the combined use of an infiltration chamber having a reaction chamber in the form of a parallelepiped that is heated at least via the side walls of the chamber, together with a load that is likewise in the form of a parallelepiped, it is possible to control temperature throughout the load. The width of the chamber, and consequently the width of the working loading volume, are limited so as to minimize the temperature gradients that can appear between the side walls of the reaction chamber extending in the longitudinal direction of the chamber, such as the walls 611 and 612. Likewise, the height of the load is limited in order to control the flow and to limit the extent to which the gas is depleted within the stacks. In contrast, the length of the chamber, and consequently the length of the load, are not limited in any way, thus making it possible to obtain a loading factor that is very large.

Examples of loading capacities for a working loading volume that is of a determined parallelepiped shape are given below:

in a working loading volume having a height of 0.52 meters (m), a width of 0.26 m, and a length of 14.6 m, it is possible by means of the present invention to load 3185 blade preforms having a length of about 10 centimeters (cm), by using a row of 65 stacks, each comprising seven loader devices in the form of rectangular parallelepipeds, each containing seven blade preforms;

in a working loading volume having a height of 0.74 m, a width of 0.34 m, and a length of 7.2 m, it is possible by means of the present invention to load 3200 blade preforms by using a row of 32 stacks, each comprising 10 loader devices in the form of rectangular parallelepipeds, each containing 10 blade preforms;

in a working loading volume having a height of 0.74 m, a width of 1 m, and a length of 2.5 m, it is possible by means of the present invention to load 3300 blade preforms by using three rows of 11 stacks, each comprising 10 loader devices in the form of rectangular parallelepipeds, each containing 10 blade preforms.

Figure 9:
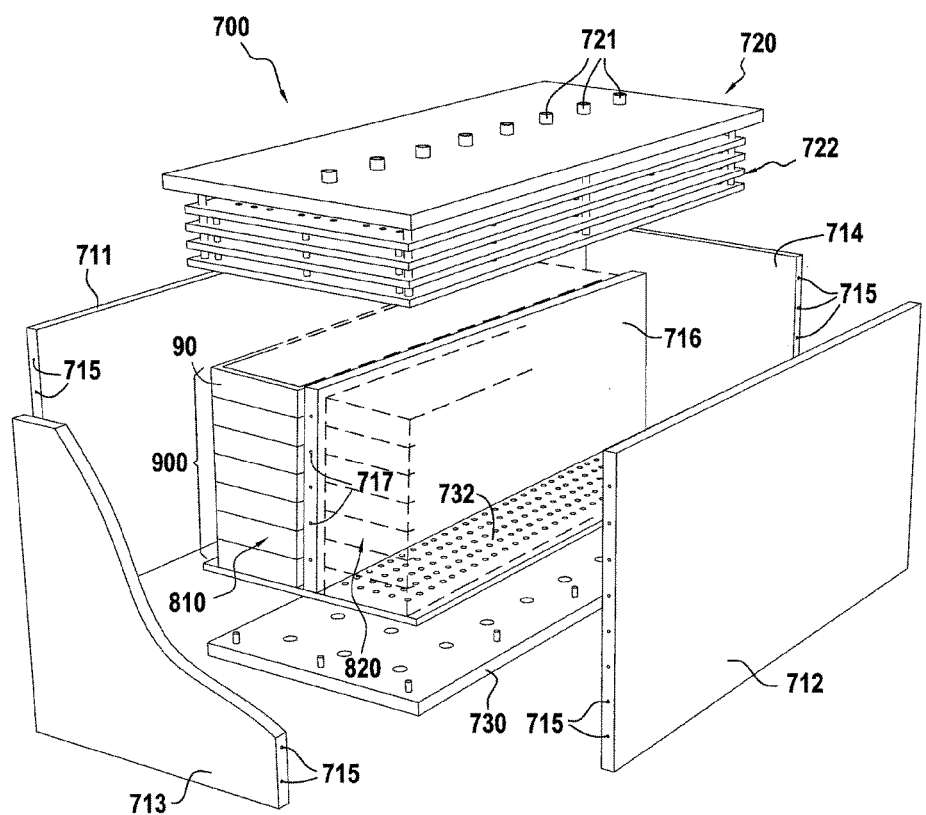
FIG. 9 is an exploded perspective view of a chemical vapor infiltration installation including a heater wall interposed between two rows of stacks of a loader device in accordance with an embodiment of the invention.

The limit on the width of the reaction chamber the purpose of controlling temperature uniformity along this dimension of the working loading volume can be pushed back by interposing, as in the chemical vapor infiltration installation 700 shown in FIG. 9, a heater wall 716 between two rows 810 and 820, each made up of stacks 900 of parallelepiped loader devices 90 that are similar to the above-described loader devices 10. The wall 716 is heated by heater means, specifically electrical resistances 717 embedded in the wall 716. The working loading volume of the reaction chamber 710 is also heated by the lateral walls 711 714 that have electrical resistance 715 embedded therein.

In a variant implementation, heater means, such as electrical resistances, are also present in the top wall and/or in the bottom wall of the reaction chamber.

The invention claimed is:
1. An installation for chemical vapor infiltration of porous preforms of three-dimensional shape, the installation comprising:
a reaction chamber of parallelepiped shape, the side walls of the reaction chamber including a heater; and
a plurality of stacks of loader devices arranged in the reaction chamber, each loader device being in the form of an enclosure of parallelepiped shape provided with support elements for receiving porous preforms for infiltrating, said enclosure comprising keying protrusions arranged on a top portion of the enclosure and keying orifices arranged in a bottom portion of the enclosure, said keying orifices being placed in positions on the bottom portion of the enclosure that do not correspond to the positions of the keying protrusions on the top portion of the enclosure, such that the keying protrusions do not share a common axis with the keying orifices, and such that each loader device must be stacked in a position rotated by 180° relative to an underlying loader device, the keying orifices being for co-operating with the keying protrusions of another loader device when the devices are stacked.

2. An installation according to claim 1, wherein the reaction chamber is of rectangular parallelepiped shape, and in that it includes at least one row of a plurality of stacks of loader devices, said row extending in the longitudinal direction of the reaction chamber.

3. An installation according to claim 2, wherein each loader device is formed by an enclosure of rectangular parallelepiped shape, the stacks being positioned in said chamber in such a manner that a longitudinal direction of each loader device extends in a direction perpendicular to the longitudinal direction of the chamber.

4. An installation according to claim 2, wherein the reaction chamber has a plurality of rows of stacks of loader devices extending in the longitudinal direction of the reaction chamber, and in that another heater is arranged between two rows of stacks of loader devices.

5. An installation according to claim 1, wherein each stack includes at each of its ends a respective buffer that is to be empty of porous substrates for densifying.

6. An installation according to claim 5, wherein the reaction chamber has horizontal walls, the horizontal walls of the reaction chamber including another heater.

7. An installation according to claim 6, wherein the loader devices of each stack comprise fiber preforms for aeroengine blades.

8. An installation according to claim 7, wherein in each loader device, the blade fiber preforms are in alignment one beside another having their pressure side faces or suction side faces oriented in a common direction.

9. An installation according to claim 8, wherein in each stack of loader devices, the fiber preforms of a first loader device are in alignment one beside another with their pressure side faces or their suction side faces oriented in a first direction, while the fiber preforms of a second loader device directly above or below said first loader device are in alignment one beside another with their pressure side faces or suction side faces oriented in a second direction opposite to the first direction.

10. An installation according to claim 1, wherein the plurality of loader devices are arranged in stacks and rows within the reaction chamber, the stacks of loader devices extending in a vertical plane and the rows of loader devices extending in a horizontal plane.

\* \* \* \* \*